United States Patent [19]

Hirachi

[11] Patent Number: 4,868,613
[45] Date of Patent: Sep. 19, 1989

[54] MICROWAVE MONOLITHIC INTEGRATED CIRCUIT DEVICE

[75] Inventor: Yasutake Hirachi, Tokyo, Japan

[73] Assignee: Fujitsu Limited, Kawasaki, Japan

[21] Appl. No.: 134,603

[22] Filed: Dec. 14, 1987

Related U.S. Application Data

[63] Continuation of Ser. No. 845,583, Mar. 28, 1986, abandoned.

[30] Foreign Application Priority Data

Apr. 5, 1985 [JP] Japan .................. 60-071035

[51] Int. Cl.[4] .......................................... H01L 29/161
[52] U.S. Cl. .......................................... 357/16; 357/22; 357/34; 357/51; 357/49; 357/55; 357/58
[58] Field of Search ................ 357/16, 22, 34, 58, 357/55, 51, 49

[56] References Cited

U.S. PATENT DOCUMENTS

| | | | |
|---|---|---|---|
| 4,494,016 | 1/1985 | Ransom et al. | 357/58 |
| 4,507,845 | 4/1985 | McIver et al. | 357/22 I |
| 4,593,301 | 6/1986 | Inata et al. | 357/16 |
| 4,593,457 | 6/1986 | Birrittella | 357/34 |
| 4,601,096 | 7/1986 | Calviello | 357/72 H |

OTHER PUBLICATIONS

Applied Physics Letters, vol. 42, No. 9, May 1, 1983, "Electrical Measurements on N+-GaAs-Undoped Ga0.6A10.4As-n-GaAs Capacitors", Solomon et al., pp. 821-823.

IEEE 1983 International Symposium on Circuits and Systems, Newport Beach, Ca., vol. 1 or 3, May 2-4, 1983, "Monolithic Microwave Integrated Circuits Fad or Fact", by Decker, pp. 413-417.

International Electron Devices Meeting 1983, Washington, D.C., Dec. 5-7, 1983, "Double Heterojunction GaAs-GaAlAs Bipolar Transistors Grown by MOCVD for Emitter Coupled Logic Circuits", by Dubon et al., pp. 689-691.

IEEE Electron Device Letters, vol. EDL-5, No. 8, Aug. 1984, "GaAs/(Ga,Al)As Heterojunction Bipolar Transistors with Buried Oxygen-Implanted Isolation Layers", by Asbeck et al., pp. 310-312.

Primary Examiner—Joseph E. Clawson, Jr.
Attorney, Agent, or Firm—Staas & Halsey

[57] ABSTRACT

A microwave monolithic integrated circuit (MMIC) device includes a transistor and a capacitor respectively formed on the same semiconductor substrate. The transistor has at least one high resistivity semiconductor layer which forms a heterojunction with an activating layer or the semiconductor substrate. The capacitor has a dielectric layer formed by the high resistivity semiconductor layer of the transistor.

20 Claims, 4 Drawing Sheets

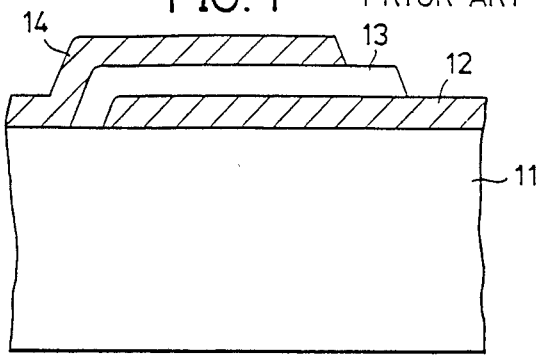
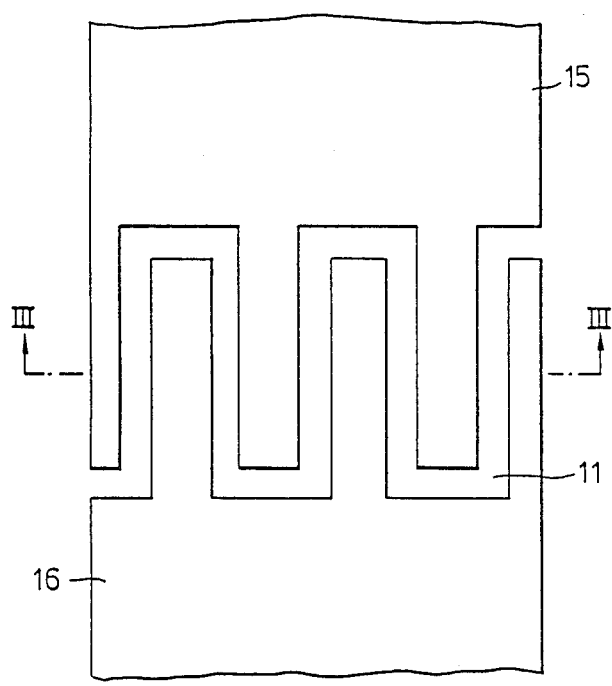

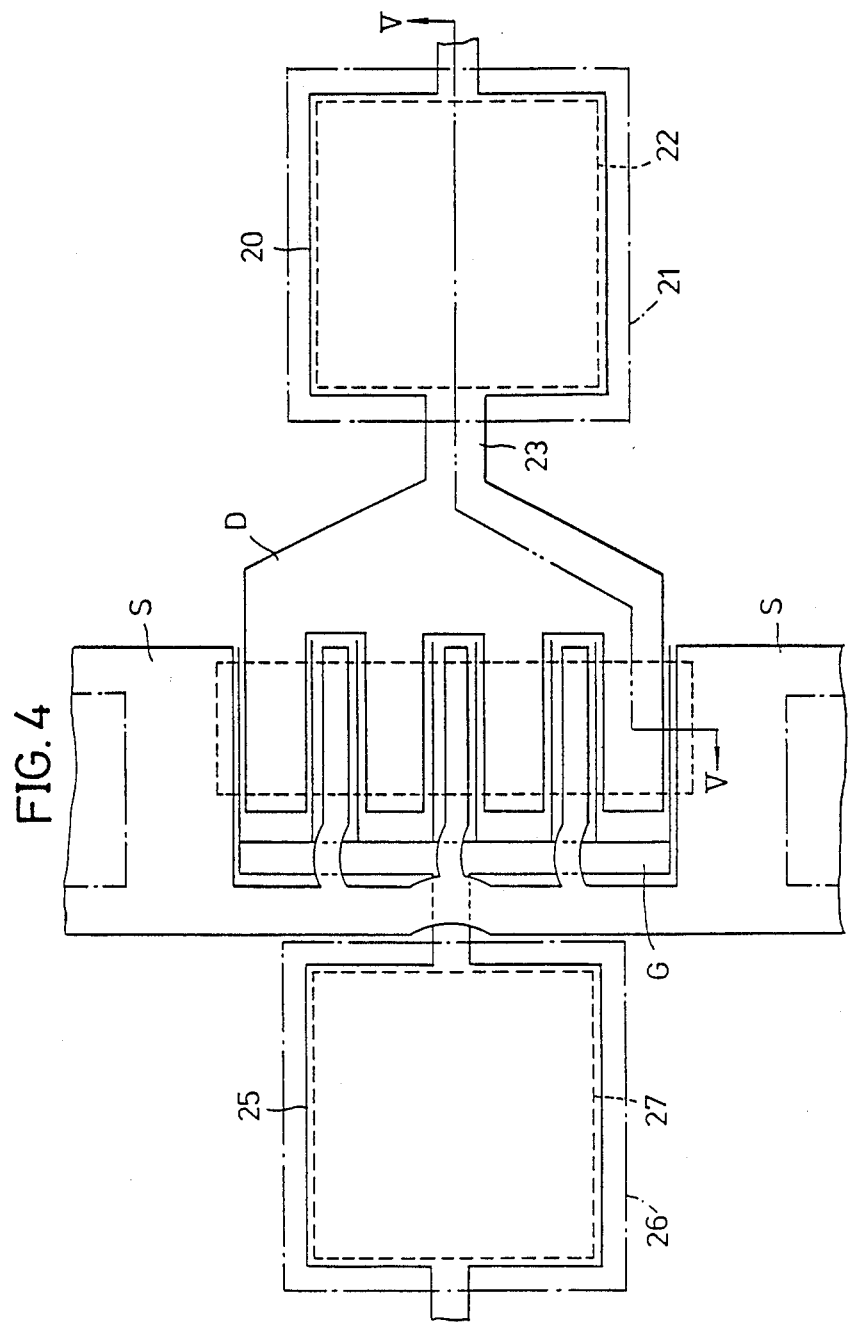

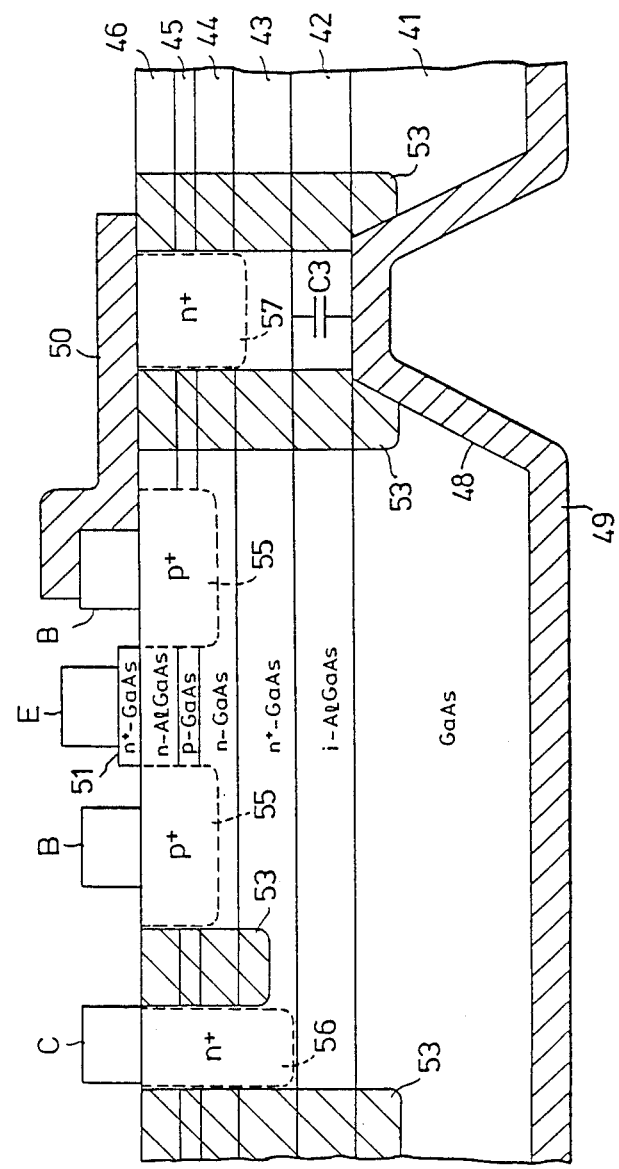

MICROWAVE MONOLITHIC INTEGRATED CIRCUIT DEVICE

This is a continuation of co-pending application Ser. No. 845,583, filed on 3/28/86, now abandoned.

BACKGROUND OF THE INVENTION

The present invention generally relates to microwave monolithic integrated circuit devices (hereinafter simply referred to as MMIC devices), and more particularly to an MMIC device which can be miniaturized and produced by simple processes.

Conventionally, an MMIC device includes a transistor and a capacitor for impedance matching. The capacitor includes a lower electrode layer, a dielectric layer and an upper electrode layer which are successively formed on a substrate. The transistor is formed on the same substrate as the capacitor, but the transistor and the capacitor are respectively formed by independent processes. For this reason, problems result due to the large number of processes required to produce the MMIC device which are complex. On the other hand, because it is difficult to accurately control the thickness of the dielectric layer, it is difficult to accurately control the capacitance of the capacitor.

Accordingly, in order to eliminate these problems, it is possible to form a first comb-shaped electrode layer and a second comb-shaped electrode layer on a substrate so that end surfaces, that is, teeth, of the first and second comb-shaped electrode layers mutually oppose each other by a predetermined separation. In this case, a capacitor is formed across a tooth of the first comb-shaped electrode layer and a corresponding tooth of the second comb-shaped electrode layer, and the capacitance of this capacitor can be controlled more accurately compared to the three-layer capacitor previously described. In addition, processes for forming a capacitor of this type are simple compared to those for forming a three-layer capacitor. However, in this case, the area occupied by the capacitor becomes extremely large, and it is impossible to miniaturize the MMIC device. Furthermore, since the transistor and the capacitor of the MMIC device are respectively formed by independent processes, it is impossible to simplify the processes of producing the MMIC device.

On the other hand, a field-effect semiconductor device was previously proposed in a U.S. patent application Ser. No. 508,545 filed June 28, 1983, in which the assignee is the same as the assignee of the present application. The previously proposed semiconductor device includes a substrate having a through-hole, a through-hole electrode formed within the through-hole and on the lower surface of the substrate, a dielectric layer formed on the upper surface of the substrate at a position where the through-hole electrode is exposed, a source electrode layer formed on the dielectric layer, and a gate electrode layer and a drain electrode layer are respectively formed on the substrate. A capacitor is formed across the source electrode layer and the through-hole electrode. According to this previously proposed semiconductor device, the dielectric layer is first formed on the upper surface of the substrate, and the through-hole is formed by an etching process using a reactive gas that stops the etching from the lower surface of the substrate at the dielectric layer. Then, the dielectric layer is patterned by an etching process in accordance with a desired capacitance, and the source electrode layer is formed on the patterned dielectric layer. Hence, in addition to processes for forming a field-effect transistor (FET) on the substrate, it is necessary to perform additional processes for forming the capacitor, such as processes for forming the dielectric layer which is not required by the FET and patterning the dielectric layer by etching. As a result, it is impossible to effectively simplify the processes of producing the semiconductor device. Moreover, when the dielectric layer is patterned by the etching, there is a problem in that surfaces of remaining parts on the substrate, e.g., the FET, are damaged by etching.

SUMMARY OF THE INVENTION

Accordingly, it is a general object of the present invention to provide a novel and useful MMIC device in which the problems described heretofore are eliminated.

Another and more specific object of the present invention is to provide an MMIC device which comprises a transistor having at least one high resistivity semiconductor layer which forms a heterojunction with an activating layer or a semiconductor substrate, and a capacitor formed on the same semiconductor substrate as the transistor and having a dielectric layer thereof formed by the high resistivity semiconductor layer of the transistor. According to the MMIC device of the present invention, it is unnecessary to perform additional steps exclusively for forming the capacitor because the high resistivity semiconductor layer of the transistor having the heterojunction is used as the dielectric layer of the capacitor, and the MMIC device has a planar structure. For this reason, the processes of producing the MMIC device can be simplified. In addition, since the size of the capacitor can be reduced, it is possible to effectively miniaturize the MMIC device as a whole. Furthermore, the thickness of the high resistivity semiconductor layer can be accurately controlled by use of molecular beam epitaxy (MBE), for example, and it is possible to accurately control the capacitance of the capacitor.

Other objects and further features of the present invention will be apparent from the following detailed description when read in conjunction with the accompanying drawings.

BRIEF DESCRIPTION OF THE DRAWINGS

FIG. 1 is a cross-sectional view of a capacitor portion a conventional MMIC device;

FIG. 2 is a plan view of a capacitor portion of another conventional MMIC device;

FIG. 4 is a plan view of a first embodiment of the MMIC device according to the present invention;

FIG. 6 is a cross-sectional view of a second embodiment of an MMIC device according to the present invention.

DESCRIPTION OF THE PREFERRED EMBODIMENTS

Figure 3:
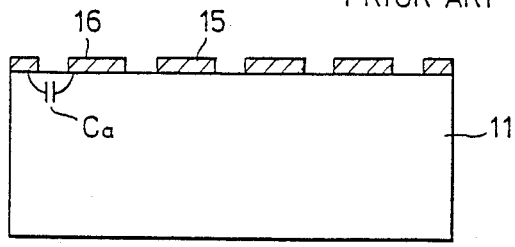
FIG. 3 is a cross-sectional view of the conventional MMIC device along a line III—III in FIG. 2.

FIG. 1 is a cross-sectional view a capacitor portion of an example of a conventional MMIC device. A lower electrode layer 12, a dielectric layer 13 and an upper electrode layer 14 are successively formed on a substrate 11. A capacitor is formed by the dielectric layer 13 formed between the upper and lower electrode layers 14 and 12. A transistor (not shown) is also formed on the substrate 11, but the transistor and the capacitor are respectively formed by independent processes. In other words, in addition to the processes for forming the transistor, it is necessary to perform additional processes, e.g. forming a $SiO_2$ layer as the dielectric layer 13, for forming the capacitor. For this reason, a large number of processes are required to produce the MMIC device and the processes are complex. On the other hand, because it is difficult to accurately control the thickness of the dielectric layer 13, it is difficult to accurately control the capacitance of the capacitor.

For convenience, in FIG. 1 and the drawings which will be described hereinafter, the thickness of the substrate is shown on a smaller scale compared to the thickness of other layers.

FIG. 2 is a plan view of a capacitor portion in another example of a conventional MMIC device, and FIG. 3 is a cross-sectional view of the conventional MMIC device along a line III—III in FIG. 2. In FIGS. 2 and 3, a first comb-shaped electrode layer 15 and a second comb-shaped electrode layer 16 are formed on the substrate 11 so that end surfaces, that is, teeth, of the first and second comb-shaped electrode layers 15 and 16 mutually oppose each other having a predetermined separation therebetween. In this case, a capacitor is formed across a tooth of the first comb-shaped electrode layer 15 and a corresponding tooth of the second comb-shaped electrode layer 16 as indicated by Ca in FIG. 3, and the capacitance of this capacitor can be controlled more accurately compared to the three-layer capacitor shown in FIG. 1. In addition, processes for forming the capacitor itself are simple compared to those of the three-layer capacitor shown in FIG. 3. However, in this case, the area occupied by the capacitor becomes extremely large, and it is impossible to miniaturize the MMIC device. Furthermore, although a transistor (not shown) is also formed on the substrate 11, the transistor and the capacitor of the MMIC device are respectively formed by independent processes. Thus, as in the case of MMIC device shown in FIG. 1, a large number of processes are required to produce the MMIC device and the processes are complex.

Accordingly, the MMIC device according to the present invention comprises a transistor having at least one high resistivity semiconductor layer which forms a heterojunction with an activating layer or a semiconductor substrate, and a capacitor is formed on the same semiconductor substrate as the transistor and has a dielectric layer formed by the high resistivity semiconductor layer of the transistor. Thus the problems of the conventional MMIC devices are eliminated.

FIG. 4 is a plan view of a first embodiment of an MMIC device according to the present invention. In FIG. 4, a source electrode, a drain electrode and a gate electrode of a heterojunction field-effect transistor (hereinafter simply referred to as an HFET) are respectively denoted by S, D and G. Electrodes 20 and 25 are upper electrodes of capacitors, and through-holes 21 and 26 are indicated by a dot-dash line. The drain electrode D and the electrode 20 are connected via a lead wire 23. Portions on the outer side of regions 22 and 27 indicated by phantom lines (dashed lines) are implanted with for example oxygen ions, so as to form a high resistivity separation region.

Figure 5:
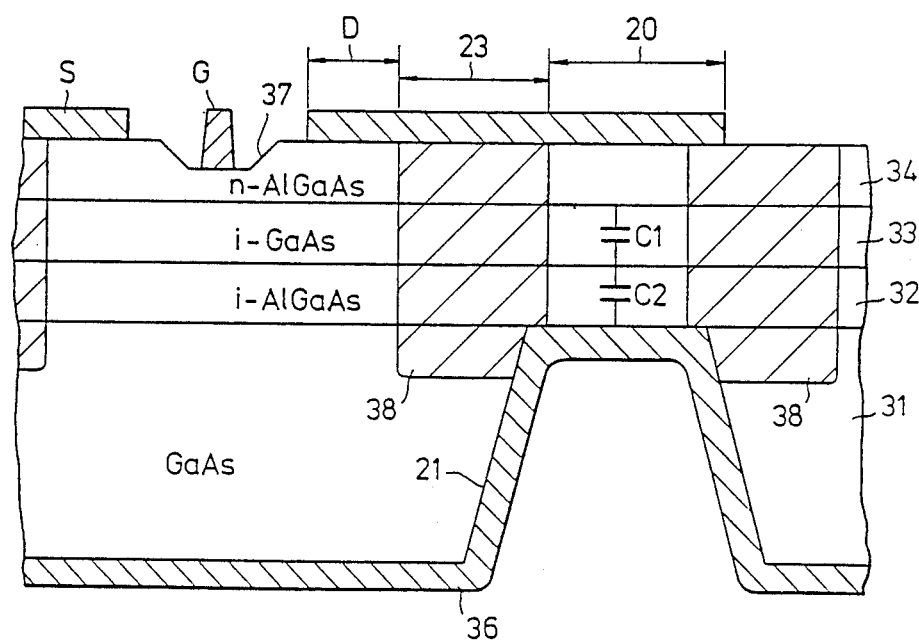
FIG. 5 is a cross-sectional view of the MMIC device along a line V—V in FIG. 4.

FIG. 5 is a cross-sectional view of the MMIC device along a line V—V in FIG. 4. In FIG. 5, those parts which are the same as those in FIG. 4 are designated by the same reference numerals, and description thereof will be omitted. In FIG. 5, the MMIC device generally comprises a semiconductor substrate 31 made of GaAs or the like, a high resistivity dielectric layer 32 made of intrinsic AlGaAs or the like and having a thickness on the order of few thousand Å, a high resistivity dielectric layer 33 as a channel layer made of intrinsic GaAs or the like and having a thickness on the order of a few thousand Å and an electron supplying layer 34 made of n-type AlGaAs or the like. A through-hole 21 is formed in the substrate 31, and an electrode 36 which forms a lower electrode of the capacitor is formed on the lower surface of the substrate 31 and within the through-hole 21. The gate electrode G is formed within a recess 37. An insulating separation region 38 is formed around a capacitor region in which capacitors C1 and C2 are formed. The insulating separation regions 38 surrounding the capacitor region and the HFET region are formed by implanting oxygen ions which have a high resistivity into the layers 34, 33 and 32 and the substrate 31.

The through-hole 21 is formed by a dry etching process which is performed on the lower surface of the GaAs substrate 31 by using, for example $CCl_2F_2$ as an etchant, example. In this case, since the etching rate of the intrinsic AlGaAs high resistivity layer 32 is extremely lower compared to that of the GaAs substrate 31, the dry etching is accurately stopped at the intrinsic AlGaAs high resistivity dielectric layer 32, that is, at the heterojunction between a spacer layer and the substrate. The electrode 36 is formed within the through-hole 21 and on the lower surface of the GaAs substrate 31 by depositing a metal material employing for example, a vapor deposition or sputtering process.

As may be seen from FIG. 5, the capacitor C1 uses the high resistivity dielectric layer 33 layer of the HFET as a dielectric layer thereof, and the capacitor C2 uses the high resistivity dielectric layer 32 of the HFET as a dielectric layer thereof. Accordingly, it is unnecessary to perform additional processes other than the processes required to form the HFET. That is, it is unnecessary to perform processes exclusively for forming the capacitors C1 and C2 such as forming the dielectric layers of the capacitors C1 and C2. Furthermore, the MMIC device has a planar structure. As a result, the processes of producing the MMIC device can be simplified compared to conventional devices. In addition, it is possible to effectively miniaturize the MMIC device as a whole because the size of the capacitors C1 and C2 can be reduced.

The capacitances of the capacitors C1 and C2 are determined by the dielectric constants of the respective high resistivity dielectric layers 33 and 32, the thicknesses of the respective high resistivity dielectric layers 33 and 32, and the areas at respective junctions between the dielectric layers and the capacitor electrodes. When the high resistivity dielectric layers 32 and 33 are respectively formed by molecular beam epitaxy (MBE), it is possible to control the thicknesses of these layers 32 and 33 with an extremely high accuracy, and the capacitances of the capacitors C2 and C1 can thus be controlled with an extremely high accuracy.

For example, in the case where the areas at the respective junctions between the dielectric layers of the capacitors C1 and C2 and the capacitor electrodes are both equal to 100 $\mu m^2$ and the thicknesses of the dielectric layers are both equal to 1000 Å, the capacitance $C_T$ of the capacitors C1 and 2 as a whole can be described by the following.

$$C_T = 8.854 \times 10^{-14} \times 12.5 \times (100 \times 10^{-4})^2/(0.2 \times 10^{-4})$$
$$= 5.5 \text{ pF}$$

In this case, the capacitance $C_T$ is suited for an MMIC device which is used in a device having a frequency in the range of 30 GHz.

In the first embodiment described heretofore, the high resistivity dielectric layers of the HFET, i.e. the channel layer 33 and the spacer layer 32 are used as the dielectric layers of the capacitor. However, the transistor which is formed on the same substrate as the capacitor is not limited to an HFET.

Next, a description is provided with respect to a second embodiment of an MMIC device according to the present invention, by referring to FIG. 6. FIG. 6 is a cross-sectional view, similar to FIG. 5, of the second embodiment of an MMIC device according to the second invention. In the present embodiment, a capacitor is formed on the same substrate as a heterojunction bipolar transistor (hereinafter simply referred to as an HBT). The MMIC device generally comprises a semiconductor substrate 41 which is made of GaAs or the like and has a thickness on the order of 20 μm, a high resistivity dielectric layer 42 as a spacer layer which is made of intrinsic AlGaAs or the like and has a thickness in the range of 0.1 to 1.0 μm, a subcollector layer 43 which is made of n+-type GaAs or the like and has a thickness on the order of 1.0 μm, a collector layer 44 which is made of m-type GaAs or the like and has a thickness on the order of 0.3 μm, a base layer 45 which is made of p-type GaAs or the like and has a thickness on the order of 0.1 μm and an emitter layer 46 which is made of n-type AlGaAs or the like and has a thickness on the order of 0.2 μm. A through-hole 48 is formed in the substrate 41, and an electrode 49 which forms a lower electrode of a capacitor is formed within the through-hole 48 and on the lower surface of the substrate 41.

A base electrode B and a collector electrode C of the HBT and an electrode 50 which forms an upper electrode of the capacitor are respectively formed on the upper surface of the substrate 41. A contact layer 51, which is made of n+-type GaAs or the like and has a thickness on the order of 0.2 μm, is formed on the emitter layer 46, and an emitter electrode E of the HBT is formed on the contact layer 51. As in the case of the first embodiment described above, an insulating separation region 53 surrounds an HBT region and a capacitor region in which a capacitor C3 is formed. The insulating separation region 53 is formed by implanting oxygen ions having a high resistivity into the layers 46, 45, 44, 43 and 42 and the substrate 41. A p+-type region 55 is formed under each of the base electrodes B, and the p+-type region 55 is formed by implanting p-type impurity ions into the layers 46, 45 and 44. An n+-type region 56 is formed under the collector electrode C, and an n+-type region 57 is formed under the electrode 50. The n+-type regions 56 and 57 are respectively formed by implanting n-type impurity ions into the layers 46, 45, 44 and 43. For example, the layers 43 through 46 are respectively doped with appropriate ions at concentrations of $6 \times 10^{18}/\text{cm}^3$, $1 \times 10^{17}/\text{cm}^3$, $1 \times 10^{18}/\text{cm}^3$, $5 \times 10^{17}/\text{cm}^3$ and $6 \times 10^{18}/\text{cm}^3$.

In the present embodiment, the capacitor C3 uses the high resistivity dielectric layer 42 of the spacer layer of the HBT as a dielectric layer thereof. Accordingly, it is unnecessary to perform additional processes other than the processes required to form the HBT. That is, it is unnecessary to perform processes exclusively for forming the capacitor C3 such as forming the dielectric layer of the capacitor C3. As a result, it is possible to obtain effects similar to those obtainable in the first embodiment described above.

According to the present invention, the MMIC device comprises a transistor having at least one high resistivity semiconductor layer which forms a heterojunction with an activating layer or a semiconductor substrate, and a capacitor formed on the same semiconductor substrate as the transistor and having a dielectric layer thereof formed by the high resistivity semiconductor layer of the transistor. Hence, it is unnecessary to perform additional processes exclusively for forming the capacitor. In addition the MMIC device has a planar structure. Therefore, the processes of producing the MMIC device are simple. Furthermore, because the size of the capacitor can be reduced, it is possible to effectively miniaturize the MMIC device as a whole. When the high resistivity semiconductor layer of the transistor is formed for example by molecular beam epitaxy (MBE), it is possible to control the capacitance of the capacitor with an extremely high accuracy.

Further, the present invention is not limited to these embodiments, but various variations and modifications may be made without departing from the scope of the present invention.

What is claimed is:

1. A microwave monolithic integrated circuit device comprising:
   a semiconductor substrate having a through-hole formed therein;
   a transistor having at least one high resistivity semiconductor layer forming a heterojunction with said semiconductor substrate;
   a capacitor including said high resistivity semiconductor layer of said transistor;
   first and second electrodes formed on opposite sides of said capacitor, said first electrode formed on a lower surface of said semiconductor substrate and within said through-hole;
   a plurality of semiconductor layers formed on said semiconductor substrate and including said high resistivity semiconductor layer; and
   an insulating separation region surrounding said capacitor, said insulating separation region having a high resistivity and being in contact with said first and second electrodes.

2. A microwave monolithic integrated circuit device as claimed in claim 1, wherein said second electrode is an electrode of said transistor.

3. A microwave monolithic integrated circuit device as claimed in claim 1, wherein said second electrode is electrically coupled to said high resistivity semiconductor layer via at least one of said plurality of semiconductor layers.

4. A microwave monolithic integrated circuit device as claimed in claim 1, wherein said semiconductor substrate comprises GaAs, and wherein said high resistivity semiconductor layer comprises intrinsic AlGaAs.

5. A microwave substrate having a lower surface and an upper surface, and having a through-hole formed in said lower surface;

a plurality of semiconductor layers formed on said semiconductor substrate and including an active layer;

a transistor having at least one high resistivity semiconductor layer, formed on said semiconductor substrate, for forming a heterojunction with said active layer;

a capacitor, including a high resistivity semiconductor layer of said transistor;

first and second electrodes formed on said lower and upper surfaces, respectively, of said semiconductor substrate and having a predetermined capacitance between said first and second electrodes, said first electrode formed within said through-hole;

an insulating separation region surrounding said capacitor and having a high resistivity, said insulating separation region contacting said first and second electrodes.

6. A microwave monolithic integrated circuit device as claimed in claim 5, wherein said transistor is a heterojunction bipolar transistor comprising:

a spacer layer corresponding to said resistivity semiconductor layer;

a collector layer formed on said spacer layer;

a base layer formed on said collector layer; and an emitter layer formed on said base layer.

7. A microwave monolithic integrated circuit device as claimed in claim 5, wherein said transistor is a heterojunction field-effect transistor comprising:

a spacer layer formed on said semiconductor substrate;

a channel layer formed on said spacer layer; and an electron supply layer formed on said channel layer, said spacer layer and said channel layer comprising said high resistivity semiconductor layer.

8. A microwave monolithic integrated circuit device as claimed in claim 5, wherein said second electrode in said capacitor region is electrically connected to said high resistivity semiconductor layer by said plurality of semiconductor layers.

9. A microwave monolithic integrated circuit device as claimed in claim 5, wherein said transistor is a heterojunction field-effect transistor, and wherein said second electrode forms a drain electrode of said heterojunction field-effect transistor.

10. A microwave monolithic integrated circuit device as claimed in claim 5, wherein said semiconductor substrate comprises GaAs, and wherein said high resistivity semiconductor layer comprises intrinsic GaAs.

11. A microwave monolithic integrated circuit device comprising:

a semiconductor substrate having a through-hole formed therein and having an upper surface and a lower surface;

a high resistivity semiconductor layer forming a heterojunction with said upper surface of said semiconductor substrate;

a transistor having a semiconductor active layer formed on said high resistivity semiconductor layer;

an insulating separation region surrounding a portion of said high resistivity semiconductor layer;

a first capacitor electrode formed on said semiconductor active layer over said portion of said high resistivity semiconductor layer and being in contact with said insulating separation region; and a second capacitor electrode formed on a surface of said portion of said high resistivity semiconductor layer in said through-hole, said second capacitor electrode being formed within said through-hole and being in contact with said insulating separation region, said first and second capacitor electrodes and said portion of said high resistivity semiconductor layer surrounded by said insulating separation region forming a capacitor.

12. A microwave monolithic integrated circuit device as claimed in claim 11, wherein said first capacitor electrode extends to an electrode of said transistor.

13. A microwave monolithic integrated circuit device as claimed in claim 12, wherein said first capacitor electrode is electrically coupled to said semiconductor active layer.

14. A microwave monolithic integrated circuit device as claimed in claim 13, wherein a portion of said semiconductor active layer under said first capacitor electrode includes impurity ions.

15. A microwave monolithic integrated circuit device as claimed in claim 11, wherein said second capacitor electrode extends to said lower surface of said semiconductor substrate.

16. A microwave monolithic integrated circuit device comprising:

a semiconductor substrate having a through-hole formed therein;

a high resistivity semiconductor layer formed on said semiconductor substrate and forming a heterojunction with said semiconductor substrate;

a semiconductor active layer formed on said high resistivity semiconductor layer and forming a heterojunction with said high resistivity semiconductor layer;

a transistor including at least a first portion of said semiconductor active layer formed on a first portion of said high resistivity semiconductor layer;

an insulating separation region surrounding a second portion of said high resistivity semiconductor layer and a second portion of said semiconductor active layer formed thereon, said second portion of said semiconductor active layer being different from first portion of said semiconductor active layer;

a first capacitor electrode formed on said second portion of said semiconductor active layer and contacting said insulating separation region; and a second capacitor electrode formed on said second portion of said high resistivity semiconductor layer in said through-hole, said second capacitor electrode being formed within said through-hole and contacting said insulating separation region, a capacitor being formed by said first and second capacitor electrodes and said high resistivity semiconductor layer.

17. A microwave monolithic integrated circuit device as claimed in claim 16, wherein said first capacitor electrode is electrically coupled to said second portion of said semiconductor active layer.

18. A microwave monolithic integrated circuit device as claimed in claim 16, wherein said transistor is a heterojunction field-effect transistor, and wherein said first capacitor electrode forms a drain electrode of said heterojunction field-effect transistor.

19. A microwave monolithic integrated circuit device, comprising:

a substrate having first and second surfaces and having a through-hole formed therein;

a spacer layer formed on said substrate and over said through-hole, said spacer layer being an intrinsic semiconductor layer forming a heterojunction with said substrate;

a channel layer formed on said spacer layer, said channel layer being an intrinsic semiconductor layer;

an electron supplying layer formed on said channel layer;

a gate electrode formed on said electron supplying layer for forming a transistor;

an insulating separation region surrounding said spacer layer, said channel layer and said electron supplying layer at a different region from said gate electrode, said insulating separating region contacting said through-hole;

a first capacitor electrode formed on said electron supplying layer surrounded by said insulating separating region and on said insulating separating region; and a second capacitor electrode formed on said spacer layer surrounded by said insulating separating region and on said insulating separating region, said second capacitor electrode being formed within said through-hole.

20. A microwave monolithic integrated circuit device, comprising:

a substrate having first and second surfaces and having a through-hole formed therein;

a spacer layer formed on the second surface of said substrate, said spacer layer being an intrinsic semiconductor layer forming a heterojunction with said substrate;

a first layer forming a collector layer formed on said spacer layer;

a second layer forming a base layer formed on said first layer;

a third layer forming an emitter layer formed on said second layer;

an emitter electrode formed on said emitter layer;

an insulating separating region surrounding said spacer layer, first layer, second layer, and third layer at a portion different from where said emitter electrode is formed, said insulating separating region being in contact with said through-hole;

a first capacitor electrode formed on said first layer surrounded by said insulating separating region and on said insulating separating region; and a second capacitor electrode formed on said spacer layer surrounded by said insulating separation region and formed in and on said insulating separating region, said second capacitor electrode being formed within said through-hole.

* * * * *